INVENTOR
SAMUEL S. IM

BY Everett A. Gartrell

ATTORNEY

United States Patent Office 3,258,660
Patented June 28, 1966

3,258,660
TUNNEL DIODE DEVICES WITH JUNCTIONS FORMED ON PREDETERMINED FACES

Samuel S. Im, Poughkeepsie, N.Y., assignor to International Business Machines Corporation, New York, N.Y., a corporation of New York
Filed June 20, 1962, Ser. No. 203,864
7 Claims. (Cl. 317—234)

The present invention is directed to tunnel diode devices and to the methods of the fabrication thereof. More particularly, the invention relates to germanium tunnel diode devices and their manufacture.

The tunnel diode, like the conventional semiconductor diode, is a two-terminal semiconductor device comprising a semiconductor body or region of one conductivity type separated from another region of the opposite type by a rectification barrier or junction. Unlike the conventional semiconductor diode, the tunnel diode has an abrupt junction with degenerate doping on both sides of that junction, the doping level being of the order of $10^{19}$ impurity atoms per cubic centimeter or greater. This is about four or five orders of magnitude greater than the doping level found in the usual semiconductor device. As a result, the phenomenon known as quantum mechanical tunneling occurs between the degenerate regions of opposite conductivity type during the operation of the tunnel diode, and the latter exhibits a negative resistance region in its current-voltage characteristic when it is forwardly biased. This phenomenon, together with the tunneling characteristic of the diode, avoids the problem or shortcoming of minority carrier drift time which is present in most semiconductor devices and makes the tunnel diode a fast operating device which is desirable for many purposes such as high-speed switching and the generation of very high frequency oscillations.

A variety of semiconductor materials such as germanium, silicon, silicon carbide, and intermetallic compounds have been employed as the parent bodies or starting wafers in making tunnel diodes. The starting wafer is very often given an N-type conductivity by heavily doping it with an active impurity material, and this may be accomplished by a variety of techniques which are well-known in the art. Heavy doping during crystal growth, the quenching of heavily doped solutions, and solid-state diffusion have all been practiced with materials such as germanium. It should be understood that P-type starting wafers may also be employed in tunnel diodes. At present, most tunnel diodes are made by the alloy-junction technique for the production of an abrupt junction. When N-type semiconductor starting wafers of a material such as germanium are being utilized, the junction and its associated P-type recrystallized region are usually made degenerative by the application of acceptor impurities such as gallium, indium, aluminum, boron or other alloys. The material selected for the starting wafer is usually dictated by factors such as cost of materials, ease of fabrication, and the particular electrical characteristics desired for the tunnel diodes. For example, germanium tunnel diodes ordinarily have higher peak currents and peak-to-valley current ratios than such devices made of silicon which, on the other hand, have greater operating voltage swings. Intermetallic compounds such as gallium arsenide are materials which are capable of withstanding operation at high temperatures and usually are more costly than germanium or silicon.

Germanium tunnel diodes have proved to be attractive because of their ease of fabrication, and as indicated above, their high peak-to-valley current ratios. For some applications, it is desirable that such devices have higher such ratios than heretofore has been obtainable. It is also advantageous to reduce the capacitance of the tunnel diodes to improve their electrical performance.

Heretofore the signal-translating speed of a tunnel diode device has been established by the extent of the doping or impurity concentration. Higher doping concentrations are conducive to higher speeds. However, there are limits to the higher concentrations of conductivity-determining impurities which may be usefully incorporated into a semiconductor member. Overdoping may produce an undesirable polycrystalline structure. It would therefore be desirable, if possible, to control or establish, during manufacture, the speed of a tunnel diode device by some means other than by the extent of the doping level.

It is an object of the invention, therefore, to provide a new and improved tunnel diode device which has improved electrical characteristics.

It is another object of the invention to provide a tunnel diode device which has improved peak-to-valley current ratio.

It is yet another object of the invention to provide a germanium tunnel diode device which not only has an improved peak-to-valley current ratio but also has a reduced capacitance.

In accordance with a particular form of the invention, a tunnel diode device comprises a body of semiconductor material of a given conductivity type having a doping level in the range of $1\times10^{19}$ to $2\times10^{20}$ atoms per cubic centimeter and a face oriented substantially parallel to a crystallographic plane within the range of 10–30 degrees off from the 111 plane. The tunnel diode device also includes an abrupt PN junction in the body established by introducing into that body at the aforesaid plane an impurity of the opposite conductivity in sufficient concentration to render a portion of the body degenerate. The tunnel diode device further includes electrical connections to the body of the aforesaid given conductivity type and to the degenerate portion of the aforesaid opposite conductivity type.

The foregoing and other objects, features and advantages of the invention will be apparent from the following more particular description of a preferred embodiment of the invention as illustrated in the accompanying drawings.

In the drawings:

FIG. 1(*b*) is a sectional view taken on the line 1(*b*)—1(*b*) of FIG. 1(*a*);

Figure 1B:
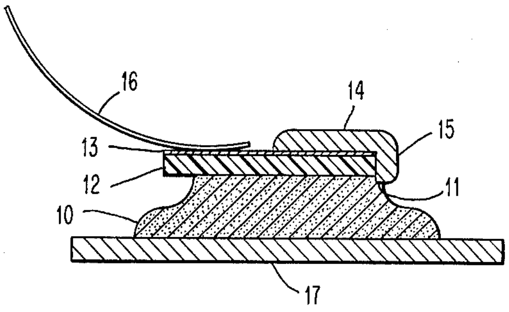
FIG. 1(*a*) is an enlarged plan view of tunnel diode device in accordance with the invention.
Figure 1A:
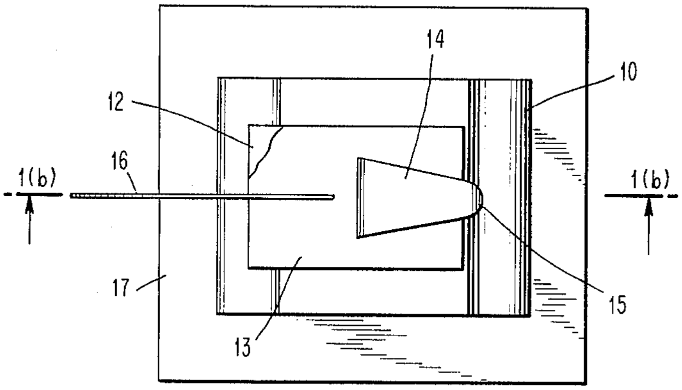

Referring now more particularly to FIGS. 1(*a*) and (*b*) of the drawings, the tunnel diode device there represented may be one of the general type disclosed and claimed in the copending application of Edward M. Davis, Jr., Serial Number 106,372, filed April 28, 1961, entitled "Semiconductor Device and Method of Making It," and assigned to the same assignee as the present invention. The device comprises a body or starting wafer 10 of semiconductor material of a given conductivity type having a doping level in the range of $1\times10^{19}$ to $2\times10^{20}$ atoms per cubic centimeter and a face oriented substantially parallel to a crystallographic plane within the range of 10–55 degrees off from the 111 plane. In a particular embodiment of the invention, the wafer 10 is made of germanium having the impurity level or doping concentration just mentioned. An embodiment which has proved to be especially attractive for some applications is a P-type germanium wafer doped with gallium in a conventional manner to a concentration of the order of $5\times10^{19}$ atoms per cubic centimeter. The desired crystallographic plane stated above is obtained in a known manner by a slicing operation performed on a single germanium crystal which is oriented optically or by an X-ray technique. As will be pointed out subsequently, various crystallographic planes within the range of 10–55 degrees off from the 111 plane may be employed, depending upon the particular characteristic wanted in the tunnel diode device.

The tunnel diode device also includes an abrupt PN junction 11 in the wafer 10 (see FIG. 1(*b*)) established by introducing thereinto at the aforesaid crystallographic plane, as by alloying, an impurity of the opposite or N conductivity type in sufficient concentration to render a portion of the wafer degenerative. The manner in which this junction is formed will be described hereinafter and corresponds to that described and claimed in applicant's copending application Serial Number 138,887, filed September 18, 1961, entitled "Tunnel Diode Device and the Method of Fabrication Thereof," now Patent 3,121,828, and assigned to the same assignee as that of the present invention. First an insulating member 12 of a suitable material such as silicon monoxide or quartz is intimately attached to a portion of the upper surface of the germanium wafer 10, which surface corresponds to the desired crystallographic plane. Member 12 is applied to the upper surface of the wafer 10 by evaporating a film having a thickness of the order of 0.15 mil, a length of about 5 mils, and a width of about the same dimensions. Evaporation may be accomplished in a conventional manner by evaporating the silicon monoxide through an apertured molybdenum mask. Next an electrically conductive film 13 is preferably attached to a portion of the surface of member 12 by evaporating in the well-known manner through an aperture in a molybdenum mask. A pure nickel skin or a thin layer of silver deposited on a thin chromium sheath have proved satisfactory as the conductive film 13. Thereafter an electrode 14 is intimately attached to a portion of the conductive film 13, and an overhanging portion 15 of the electrode 14 is alloyed with the wafer 10. Electrode 14 is preferably made from an alloy member or pellet, a particularly useful embodiment of which contains 2% arsenic, 5% antimony, 58% tin and 35% lead. It will be understood however, that other proportions of the elements just mentioned may be employed. As disclosed and claimed in Patent 3,121,828, the pellet may contain by weight arsenic within the range of 0.1 to 5%, antimony within the range of 0.1 to 10%, tin within the range of 15 to 80%, and the balance lead. The electrode 14 may be intimately attached to a portion of the conductive film 13 and to a portion of the wafer 10 by evaporating a pellet containing its four components through the aperture in a suitable molybdenum mask. Alternatively, the components of the pellet may be evaporated in succession on the exposed portions of the metal film 13 and the wafer, the arsenic being evaporated between the evaporation of two of the other components. The arsenic is believed to be the active impurity of the pellet which, when alloyed with the germanium wafer 10, thins the transition region of the tunnel diode to about 75 angstroms and creates a degenerate N-type germanium region at the overhang 15 in a manner well understood in the art.

The device further includes electrical connections to the P-type body 10 and to the degenerate portion or overhang 15 of the N conductivity type. To this end, a connection in the form of a thin wire 16 is attached to the metal film 13 in a suitable manner as by thermocompression bonding. Thermocompression bonding techniques have been published by H. W. Christensen in the April 1958 issue of the Bell Telephone Laboratory Record at pages 127–130. Briefly, this procedure involves the application of heat and pressure by a chisel-edged tool to the end of the lead 16 resting on the metal film 13 so as to effect a good mechanical and electrical bond at the point of interconnection. A conductor in the form of a metal plate 17 is attached to the lower surface of the semiconductor wafer 10 with an ohmic solder, thus establishing with the wire 16, the film 13 and the electrode 14 electrical connections to opposite sides of the PN junction 11.

Figure 2:
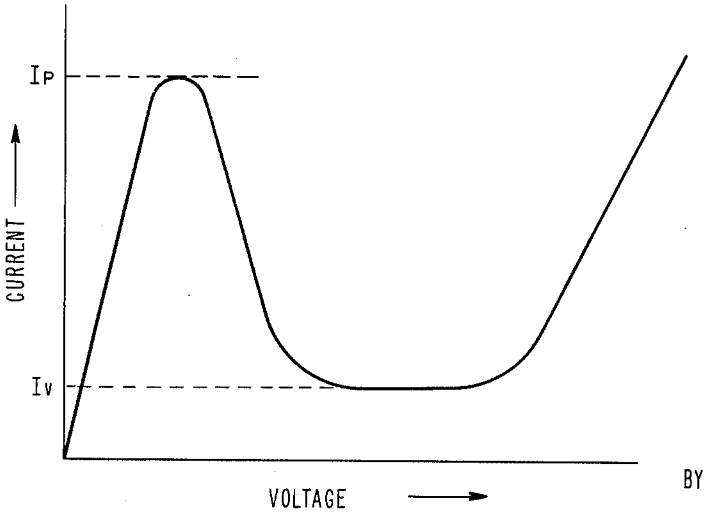
FIG. 2 is a curve used in explaining an advantage of the device of FIG. 1.

In the manner explained in the above-identified copending application of Edward M. Davis, Jr., an etching operation, which was performed to reduce the size of the PN junction 11 to a value which is effective to establish the desired current-voltage characteristic of the sort represented in FIG. 2 is also effective to remove some of the upper portions of the semiconductor wafer so that the insulating member 12 now overhangs a portion of the wafer as represented in FIG. 1(*d*).

The alloying operation will be explained briefly. However, for further details thereon, reference is made to applicant's Patent 3,121,828. Since arsenic sublimes at a temperature above 600° C. and because arsenic is one of the elements in the multi-component material employed to form the electrode 14 and the junction 11, it is not advisable to employ alloying temperatures greater than about 600° C. The alloying may be accomplished by starting with the multi-component pellet and the wafer at room temperature and then introducing the assembly into an alloying furnace so that the temperature of the assembly increases to about 600° C. in several seconds, such as about 5 seconds. Thereafter, the assembly and the furnace are allowed to cool at a rapid rate to room temperature.

Applicant is unable to provide an explanation as to why there is produced a semiconductor device that exhibits quantum mechanical tunneling when a PN junction is formed in the device by introducing a first type of conductivity-directing impurity into a predetermined face of a degeneratively doped semiconductor body of the opposite conductivity type, which face is oriented substantially parallel to a crystallographic plane within the range of 10–55 degrees off from the 111 plane. However, the following information will aid in revealing the merits of applicant's invention.

Heretofore it has been the common practice to fabricate a tunnel diode device by alloying an impurity body with a degenerate wafer on the 111 crystallographic plane of the latter. The following table indicates the peak tunnel-current to valley-current ratios $I_p/I_v$ were obtained with tunnel diodes made from 10 starting wafers obtained from a crystal cut on the 111 plane and from 10 wafers from the crystal cut on the 211 and 221 planes and from a plane 20° off from the 111 plane in the manner explained above.

| Crystal | Plane | $I_p/I_v$ Range | Plane | $I_p/I_v$ Range |
|---|---|---|---|---|
| #1 | 111 | 2.4–5.3 | 211 | 9.5–12.1 |
| #2 | 111 | 5.7–8.4 | 221 | 9.9–12.5 |
| #3 | 111 | 1.1–3.24 | 20° off from 111. | 9.2–11.8 |

It will be seen from the foregoing chart that a material increase in the peak-current to valley-current ratio in a tunnel diode may be obtained by employing the designated crystallographic planes other than the 111 plane.

Figure 3:
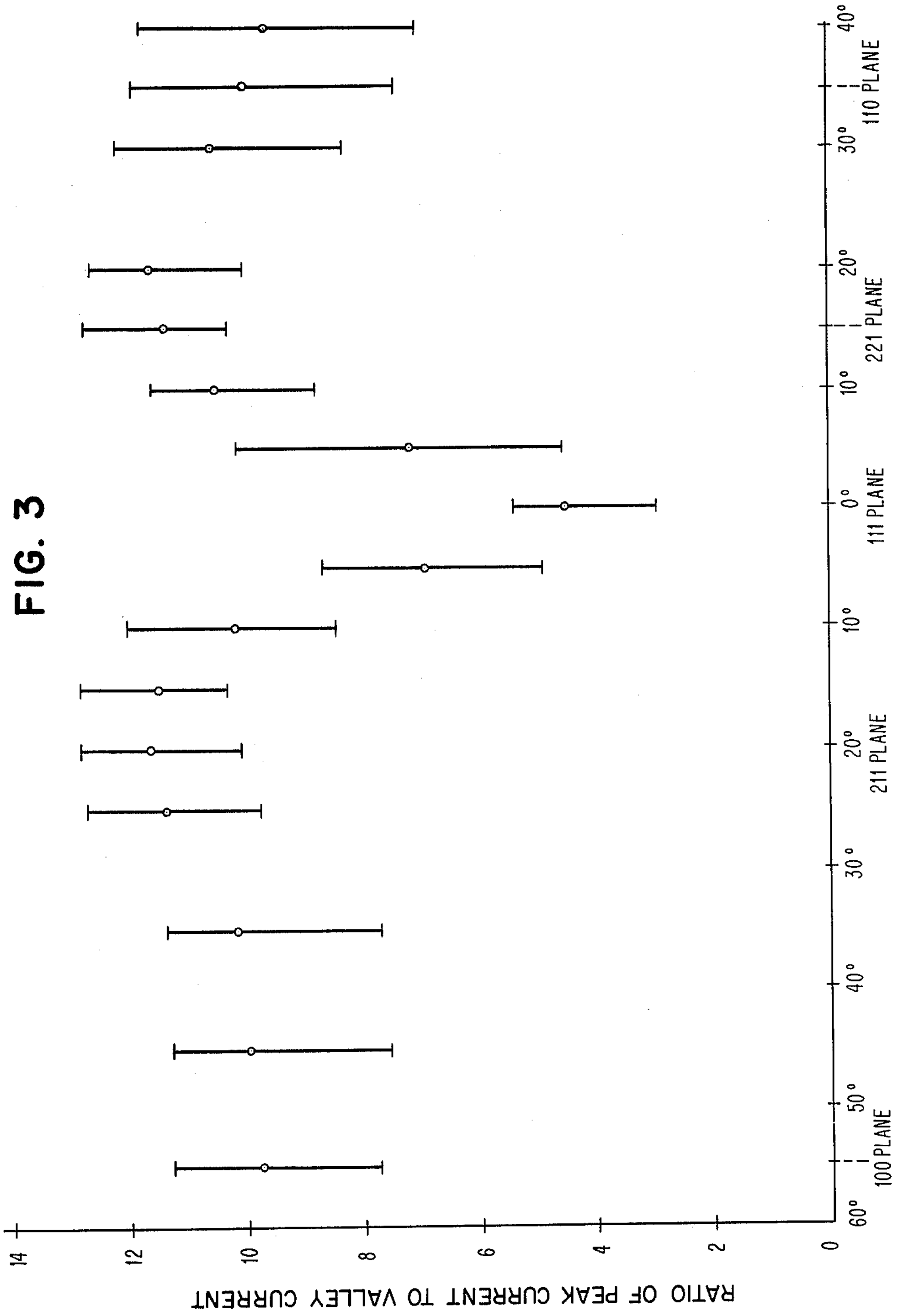
FIG. 3 is a graph employed in explaining the invention of the device of FIG. 1.

FIG. 3 of the drawings is a chart which demonstrates graphically the improvement in the peak-current to valley-current ratio of a tunnel diode which results when the alloying with the wafer is performed on various crystallographic planes. The axis of ordinates represents the value of peak-current to valley-current ratio while the axis of abscissas is graduated in degrees, various of the crystallographic planes also being identified thereat. It will be seen that the 111 plane is identified at 0 degree, the 221 plane being approximately 15 degrees off from the 111 plane on one side thereof and the 110 plane being about 35 degrees off therefrom on that same side. The 211 plane is about 20 degrees off from the 111 plane on the other side of the latter while the 100 plane is about 55 degrees off therefrom on the same side. The vertical lines drawn at different degrees represent the spread or variation in peak-current to valley-current ratios experienced in each instance with 40 tunnel diode devices, while the small circle on each vertical line represents the average ratio for those devices. It will be seen that the peak-current to valley-current ratio is lowest for the 111 plane and that a remarkable increase in that ratio exists when a plane at least 10 degrees off from the 111 plane is employed. It will also be observed that the average value of peak-current to valley-current ratio does not vary greatly in the range of 10–55 degrees from the 111 plane, and that the range of 10–20 degrees therefrom appears to be very attractive. It also appears that it is desirable to make a tunnel diode device by establishing a PN junction in a wafer face corresponding to any of the family of the 100, the 211, the 221 and the 110 planes.

Figure 4:
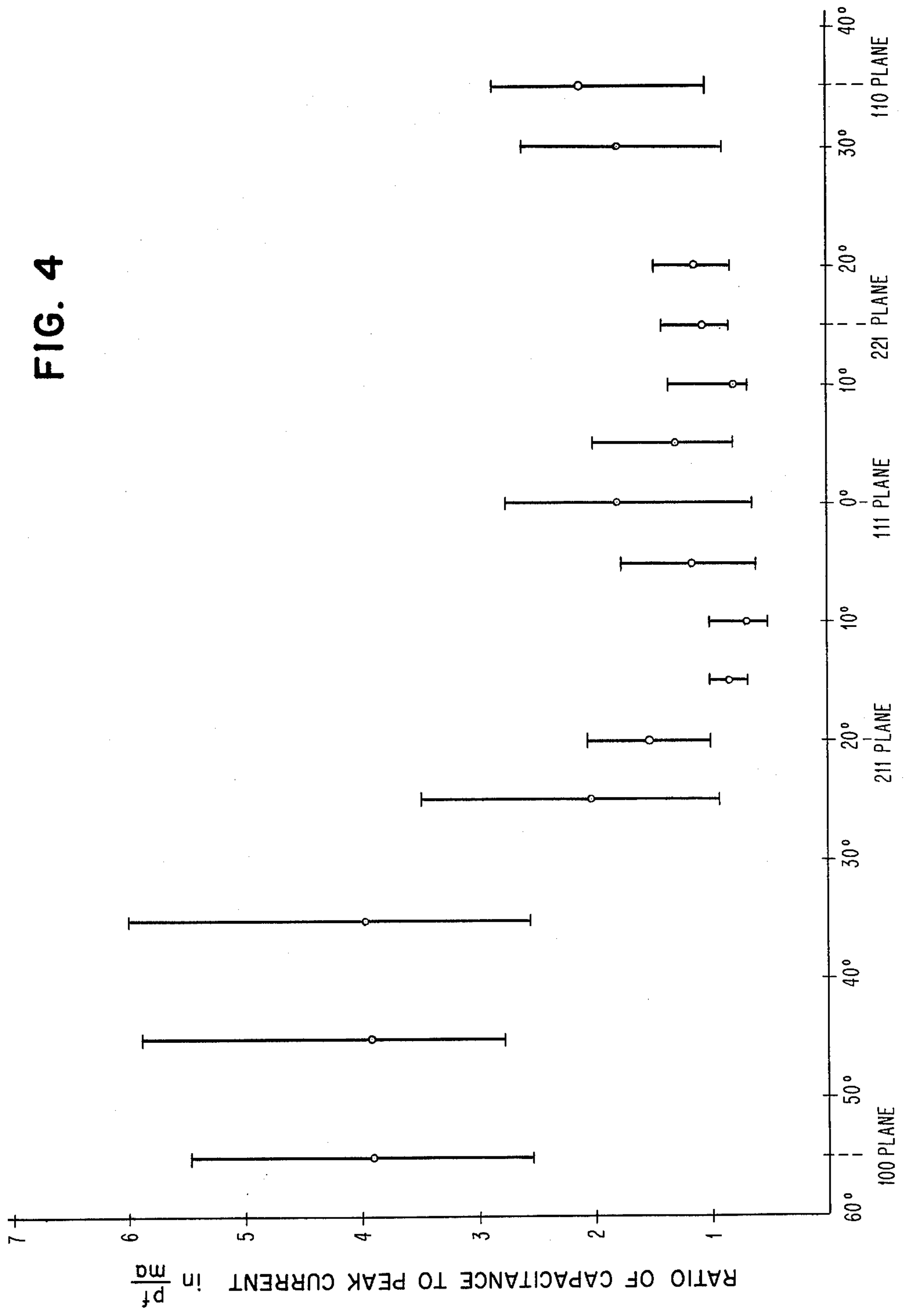
FIG. 4 is another graph also employed in explaining the present invention.

FIG. 4 is similar in construction to FIG. 3 except that the axis of ordinates represents the ratio of capacitance to peak tunnel current. Since the signal-translating speed of a tunnel diode is inversely proportional to its capacitance, the higher the number on the axis of ordinates the slower the speed of the device. Thus the use in a tunnel diode of a crystallographic plane of about 10–20 degrees from the 111 plane is conducive to a high speed device; a plane in the range of about 20–35 degrees from the 111 plane is useful for a medium speed tunnel diode; while a plane in the range of about 35–55 degrees from the 111 plane is desirable for a slow speed device. Also best uniformity in the speed of devices may be obtained by using a plane in the range of from about 10–20 degrees from the 111 plane as evidenced by the short vertical lines appearing in the range just mentioned.

It will be seen from the above, that the signal-translating speed of a tunnel diode is controlled by the selection of the crystallographic plane wherein one alloys to form the PN junction. This represents an extremely useful tool in the manufacture of such devices and avoids some of the critical problems which heretofore have arisen in connection with the very heavy doping in the semiconductor regions. In addition to being assured of greater freedom in the determination of the speed of a tunnel diode device, the designer thereof now has a further element of control in that he may achieve high peak-current to valley-current ratios.

While the invention has been described in connection with the formation of the PN junction of the tunnel diode by an alloying step, it will be apparent to one skilled in the art that other techniques such as epitaxial vapor deposition may be employed to form a suitable junction. One such technique is disclosed and claimed in Patent 3,014,820, Marinace et al., granted December 26, 1961, entitled "Vapor Grown Semiconductor Device," and assigned to the same assignee as the present invention.

While the invention has been shown and described with reference to a preferred embodiment thereof, it will be understood by those skilled in the art that various changes in form and details may be made therein without departing from the spirit and scope of the invention.

What is claimed is:

1. A tunnel diode device comprising:
a body of semiconductor material of a given conductivity type having a doping level in the range of $1\times10^{19}$ to $2\times10^{20}$ atoms per cubic centimeter and a face oriented substantially parallel to a crystallographic plane within the range of 10–30 degrees off from the 111 plane;
an abrupt PN junction in said body established by introducing into said body at said plane an impurity of the opposite conductivity type in sufficient concentration to render a portion of said body degenerate; and
electrical connections to said body of said given conductivity type and to said degenerate portion of said opposite conductivity type.

2. A tunnel diode device comprising:
a body of germanium semiconductor material of a given conductivity type having a doping level in the range of $1\times10^{19}$ to $2\times10^{20}$ atoms per cubic centimeter and a face oriented substantially parallel to a crystallographic plane within the range of 10–30 degrees off from the 111 plane;
an abrupt PN junction in said body established by introducing into said body at said plane an impurity of the opposite conductivity type in sufficient concentration to render a portion of said body degenerate; and
electrical connections to said body of said given conductivity type and to said degenerate portion of said opposite conductivity type.

3. A tunnel diode device comprising:
a body of germanium semiconductor material of a given conductivity type having a doping level in the range of $1\times10^{19}$ to $2\times10^{20}$ atoms per cubic centimeter and a face oriented substantially parallel to a crystallographic plane within the range of 10–20 degrees off from the 111 plane;
an abrupt PN junction in said body established by introducing into said body at said plane an impurity of the opposite conductivity type in sufficient concentration to render a portion of said body degenerate; and
electrical connections to said body of said given conductivity type and to said degenerate portion of said opposite conductivity type.

4. A tunnel diode device comprising:
a body of germanium semiconductor material of a P conductivity type doped with gallium to a concentration of the order of $1\times10^{19}$ to $2\times10^{20}$ atoms per cubic centimeter to render said body degenerate and having a face oriented substantially parallel to a crystallographic plane within the range of 10–30 degrees off from the 111 plane;
an abrupt PN alloy junction in said body established by alloying with said body at said plane at least one impurity of the N conductivity type in sufficient concentration to render a portion of said body degenerate; and
electrical connections to said body of said P conductivity type and to said degenerate portion of said N conductivity type.

5. A tunnel diode device comprising:
a body of germanium semiconductor material of a P conductivity type doped with gallium to a concentration of the order of $5\times10^{19}$ atoms per cubic centimeter to render said body degenerate and having a face oriented substantially parallel to a crystallographic plane within the range of 10–30 degrees off from the 111 plane;
an abrupt PN alloy junction in said body established by alloying with said body at said plane at least one impurity of the N conductivity type in sufficient concentration to render a portion of said body degenerate; and
electrical connections to said body of said P conductivity type and to said degenerate portion of said N conductivity type.

6. A tunnel diode device comprising:
a body of germanium semiconductor material of a P conductivity type doped with gallium to a concentration of the order of $1\times10^{19}$ to $2\times10^{20}$ atoms per cubic centimeter to render said body degenerate and having a face oriented substantially parallel to a crystallographic plane within the range of 10–30 degrees off from the 111 plane;

an abrupt PN alloy junction in said body established by alloying with said body at said one plane a member of the N conductivity directing type containing 2% arsenic, 5% antimony, 58% tin and 35% lead to render a portion of said body degenerate; and electrical connections to said body of said P conductivity type and to said degenerate portion of the N conductivity type.

7. In a device exhibiting quantum mechanical tunneling:

a degeneratively doped body of semiconductor material of one conductivity type having a face which is oriented substantially parallel to a crystallographic plane within the range of 10–30 degrees from the 111 plane; and a degeneratively doped region of the opposite conductivity type formed in said face and separated from said body by a PN junction with a narrow transition layer.

References Cited by the Examiner

UNITED STATES PATENTS

| | | | |
|---|---|---|---|
| 3,088,856 | 5/1963 | Wannlund et al. | 317—235 |
| 3,109,758 | 11/1963 | Batdorf et al. | 148—33.1 |
| 3,121,828 | 2/1964 | Im | 317—234 |
| 3,131,096 | 4/1964 | Sommers | 317—234 |

JOHN W. HUCKERT, *Primary Examiner.*

JAMES D. KALLAM, *Examiner.*

R. F. POLISSACK, *Assistant Examiner.*